United States Patent [19]

Borza

[11] Patent Number: 5,907,627
[45] Date of Patent: May 25, 1999

[54] CONTACT IMAGING DEVICE

[75] Inventor: Stephen J. Borza, Ottawa, Canada

[73] Assignee: Dew Engineering and Development Limited, Ontario, Canada

[21] Appl. No.: 08/554,357

[22] Filed: Nov. 6, 1995

[51] Int. Cl.⁶ ............................................. G06K 9/00
[52] U.S. Cl. ................................. 382/124; 250/208.1
[58] Field of Search ............................. 382/124, 125, 382/126, 115; 340/825.34; 356/71, 74; 178/18; 250/208.1, 553

[56] References Cited

U.S. PATENT DOCUMENTS

| | | | |
|---|---|---|---|
| 4,429,413 | 1/1984 | Edwards | 382/124 |
| 4,577,345 | 3/1986 | Abramov | 382/124 |
| 4,695,716 | 9/1987 | Tandon et al. | 250/211 |
| 5,325,442 | 6/1994 | Knapp | 382/4 |
| 5,559,504 | 9/1996 | Itsumi et al. | 340/825.3 |

FOREIGN PATENT DOCUMENTS 2219870  12/1989  United Kingdom.

*Primary Examiner*—Christopher S. Kelley
*Attorney, Agent, or Firm*—Neil Teitelbaum Associates

[57] ABSTRACT

A fingerprint sensing device and recognition system includes an array of closely spaced apart semiconductor dies bonded to a substrate. The dies are spaced with a minimal space that will ensure that adjacent edges of the dies do not wipe against one another when a finger is pressed upon them. Each die includes an row/column array of sense elements that are coupled to a drive circuit and a sense circuit by sets of row and column conductors, respectively. The sense elements are actively addressable by the drive circuit. Capacitances resulting from individual finger surface portions in combination with sense electrodes are sensed by the sense circuit by applying a potential to the sense electrodes and measuring charging characteristics.

15 Claims, 11 Drawing Sheets

Prior Art

*Prior Art* *Prior Art*
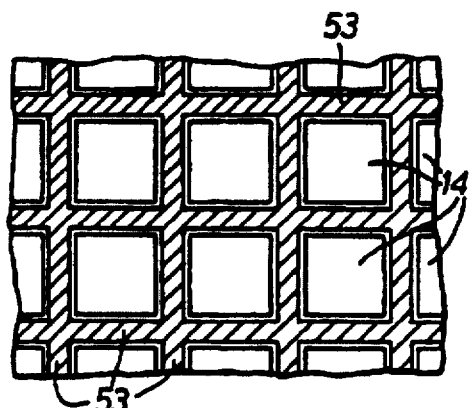
Fig. 7a
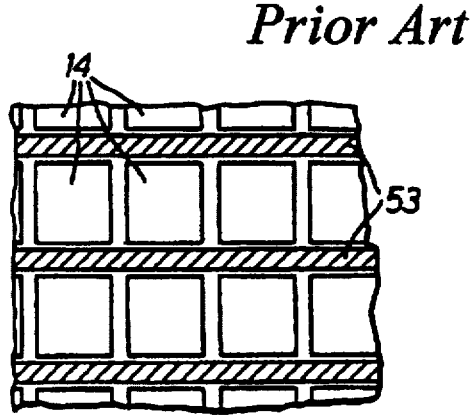
Fig. 7b
Fig. 8.
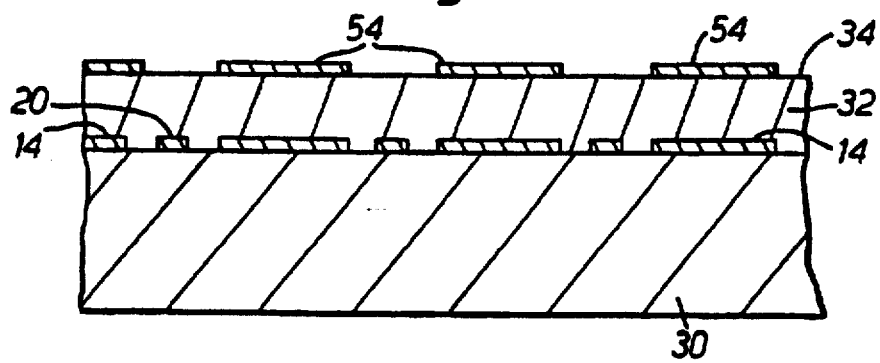
*Prior Art*
Fig. 9.
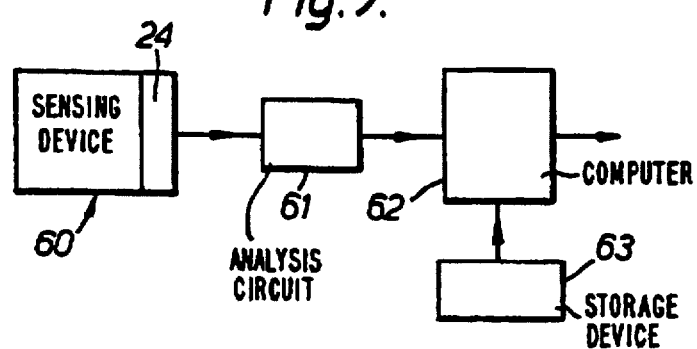
*Prior Art*

CONTACT IMAGING DEVICE

FIELD OF THE INVENTION

This invention relates generally to imaging devices and more particularly to contact imaging devices for imaging fingerprints and the like.

BACKGROUND OF THE INVENTION

In a fingerprint input transducer or sensor, the finger under investigation is usually pressed against a flat surface, such as a side of a glass plate, and the ridge and valley pattern of the finger tip is sensed by a sensing means such as an interrogating light beam. Various optical devices are known which employ prisms upon which a finger whose print is to be identified is placed. The prism has a first surface upon which a finger is placed, a second surface disposed at an acute angle to the first surface through which the fingerprint is viewed and a third illumination surface through which light is directed into the prism. In some cases, the illumination surface is at an acute angle to the first surface, as seen for example, in U.S. Pat. Nos. 5,187,482 and 5,187,748. In other cases, the illumination surface is parallel to the first surface, as seen for example, in U.S. Pat. Nos. 5,109,427 and 5,233,404. Fingerprint identification devices of this nature are generally used to control the building-access or information-access of individuals to buildings, rooms, and devices such as computer terminals.

One of the problems associated with fingerprint sensors concerns the reliable and accurate transformation of ridge and valley pattern of the finger tip into electrical or optical signals to be stored in a digital format. Optical systems as described above, for example using a prism, require sophisticated equipment and tend to be bulky and costly.

In an attempt to overcome some of the limitations and disadvantages of using optical systems based on illumination of the finger tip, U.S. Pat. No. 4,353,056 in the name of Tsikos issued Oct. 5, 1982, discloses an alternative kind of fingerprint sensor that uses a capacitive sensing approach. The described sensor has a two dimensional, row and column, array of capacitors, each comprising a pair of spaced electrodes, carried in a sensing member and covered by an insulating film. The sensors rely upon deformation to the sensing member caused by a finger being placed thereon so as to vary locally the spacing between capacitor electrodes, according to the ridge/trough pattern of the fingerprint, and hence, the capacitance of the capacitors. In one arrangement, the capacitors of each column are connected in series with the columns of capacitors connected in parallel and a voltage is applied across the columns. In another arrangement, a voltage is applied to each individual capacitor in the array. Sensing in the respective two arrangements is accomplished by detecting the change of voltage distribution in the series connected capacitors or by measuring the voltage values of the individual capacitances resulting from local deformation. To achieve this, an individual connection is required from the detection circuit to each capacitor.

While the described sensor may not suffer from the problems associated with the kind of sensor employing an optical sensing technique, it suffers from its own problems. For example, because the sensor relies in operation on deformation and requires the use of resilient materials, problems with durability and reliability may be experienced. Moreover, the need to provide a respective connection to each individual capacitor in the array means that a very large number of connecting lines is necessary. This creates difficulties, both in the fabrication of the sensing member and its interconnection with the detection circuit. In practice the large number of connections would likely also cause operating difficulties due to stray capacitances.

In yet another attempt to improve upon deficiencies and limitations of the aforementioned and other prior art, a further contact imaging device is described in U.S. Pat. No. 5,325,442 in the name of Knapp, issued Jun. 28, 1994. Those parts of the disclosure of this patent not included in this specification are incorporated herein by reference.

Knapp describes making an imaging device in the form of a single large active matrix array involving deposition and definition by photolithograpic processes of a number of layers on a single large insulating substrate. Electrodes and sets of address conductors formed of metal and field effect transistors are formed as amorphous silicon or polycrystalline silicon thin film transistors (TFTs) using an appropriate substrate of, for example, glass or quartz.

Although Knapp attempts to provide an improvement over Tsikos mentioned above, other disadvantages and limitations become evident in the manufacture implementation of Knapp's disclosed device. Firstly, it is extremely difficult to produce a single large imaging contact device, for example comprised of a single silicon die cut from a silicon wafer. Fabricating a device with a contact area of 0.75 inches by 0.75 inches or larger, approximately a required dimension for imaging a fingerprint, is impractical due to the fragile nature of silicon devices. Aside from large dies being costly to manufacture, they have lower manufacturing yields than smaller dies. When square or rectangular dies are cut from a substantially round silicon wafer, there is less loss at the edges of the wafer when small dies are cut. The mechanical strength of these chips also limits their use in contact applications; for instance, the force of a finger contacting and resting upon a large die can cause a crack or stress fracture. Furthermore, current, conventional photolithographic systems are typically equipped for the production of dies that have a maximum dimension of about 0.4 inches to 0.5 inches.

OBJECT OF THE INVENTION

Thus, in an attempt to overcome these and other limitations of known prior art devices, it is an object of this invention to provide a more robust contact imaging device.

It is an object of the invention to provide a device that utilizes a plurality of small dies arranged in an array to overcome some of the aforementioned limitations of utilizing a single large semiconductor die.

It is a further object of the invention to provide a contact imaging device that is relatively inexpensive and practicable to manufacture.

SUMMARY OF THE INVENTION

Thus, in accordance with an aspect of this invention, a contact imaging device is provided, wherein the contact area is comprised of a plurality of silicon contact imaging dies in the form of an array of chips bonded in close proximity to one another to a backing material, preferably with a similar coefficient of thermal expansion (CTE) to that of silicon or the material that the array is comprised of For assembly of these arrays on a single substrate, it is preferable that each die be designed with input/output (I/O) conductors on only two or preferably one side to the contact imaging silicon device.

In accordance with another aspect of the invention, a contact imaging device is provided comprising an array of dies spaced in close proximity to each other, the dies being bonded to a substrate in the form of an array of dies for sensing a single fingerprint, each die comprising an array of sense elements for sensing the presence of a fingerprint ridge upon the device.

In accordance with the invention there is further provided, a fingerprint sensing device, comprising: a plurality of semiconductor dies, each having: an array of sense elements, each of which includes a sense electrode and a switching device coupled to one another, all of the sense electrodes of said sense elements being covered by dielectric material defining a sensing surface adapted to receive a finger having individual finger surface portions. The device further includes drive means coupled to all of the switching devices of said sensing elements for controlling and addressing each switching device according to a sequence independent of the fingerprint to be sensed so that a predetermined potential is applied via each switching device when addressed to the sense electrode coupled thereto; and sensing means coupled to all of the switching devices of said sense elements for sensing capacitance based on said individual finger surface portions in combination with sense electrodes of said sense elements. The dies are arranged in an tightly spaced array of dies and are bonded to a substrate.

In accordance with the invention there is further provided, a fingerprint capture device comprising a substrate and an array of at least 4 spaced apart dies bonded to the substrate. Each die comprises an array of sense elements for sensing the presence of a fingerprint ridge upon the device, the substrate including a plurality of conductors providing a plurality of electrical paths from the sense elements on each of the 4 spaced apart dies, to driving sensing circuitry; and the fingerprint capture device includes a processor means coupled to the driving and sensing circuitry for processing signals provided from the sensing circuitry.

BRIEF DESCRIPTION OF THE DRAWINGS

Exemplary embodiments of the invention will now be described in conjunction with the following drawings, in which:

FIG. 1c is a simplified diagram showing an epoxy dispense pattern used to bond the 4 chip array of FIG. 1a;

FIGS. 7a and 7b show respectively schematically in plan, two prior art modified forms of the sensing device;

FIG. 8 is a schematic cross-sectional view through a part of another prior art embodiment of sensing device; and, FIG. 9 is a schematic block diagram of a typical fingerprint recognition system incorporating a sensing device.

DETAILED DESCRIPTION

Figure 1:
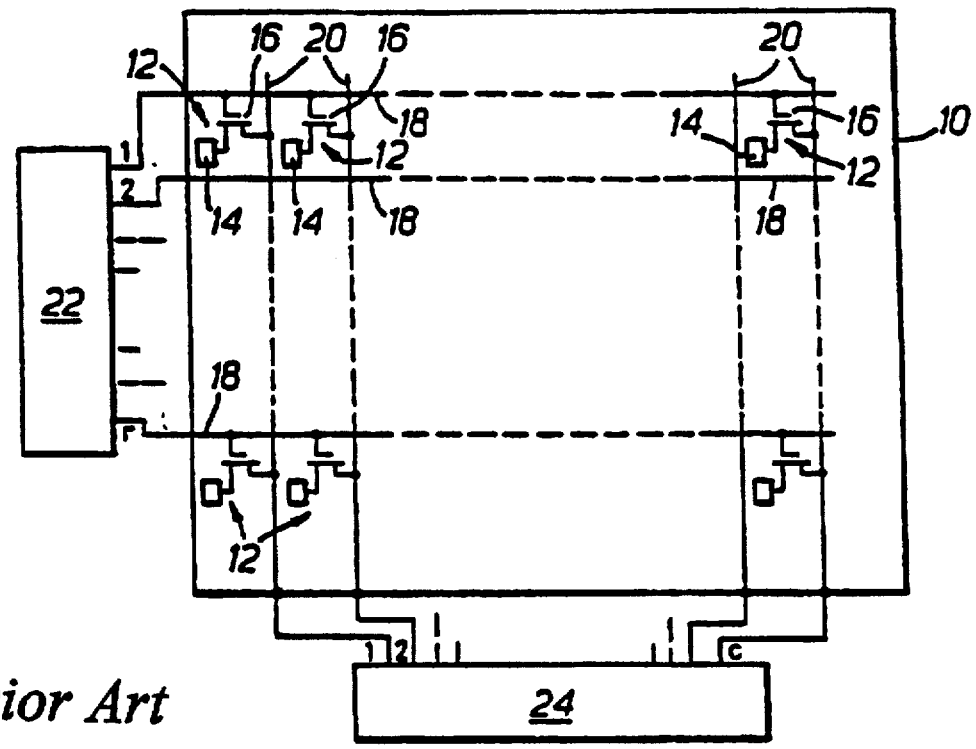
FIG. 1 is a simplified diagram of a prior art sensing device showing an array of sensing elements together with associated addressing circuitry.

Referring to now FIG. 1, a prior art sensing device is shown having a single active matrix addressed sensing pad 10 having an X-Y array of sense elements consisting of r rows (1 to r) with c sensing elements 12 in each row. In practice there maybe around 300 rows and 200 columns of regularly-spaced elements occupying an area of approximately 2 cm×3 cm. As was discussed in the background of the invention, such large single chip devices are difficult and costly to manufacture. FIG. 1g, illustrates a 28% increase in yield using a 0.375×0.375 inch die (shown on the right of the figure) over a 0.75×0.75 inch die (shown on the left of the figure). Furthermore, larger devices are more prone to cracks and fractures, hence the longevity of a single chip device is suspect.

Figure 1A:
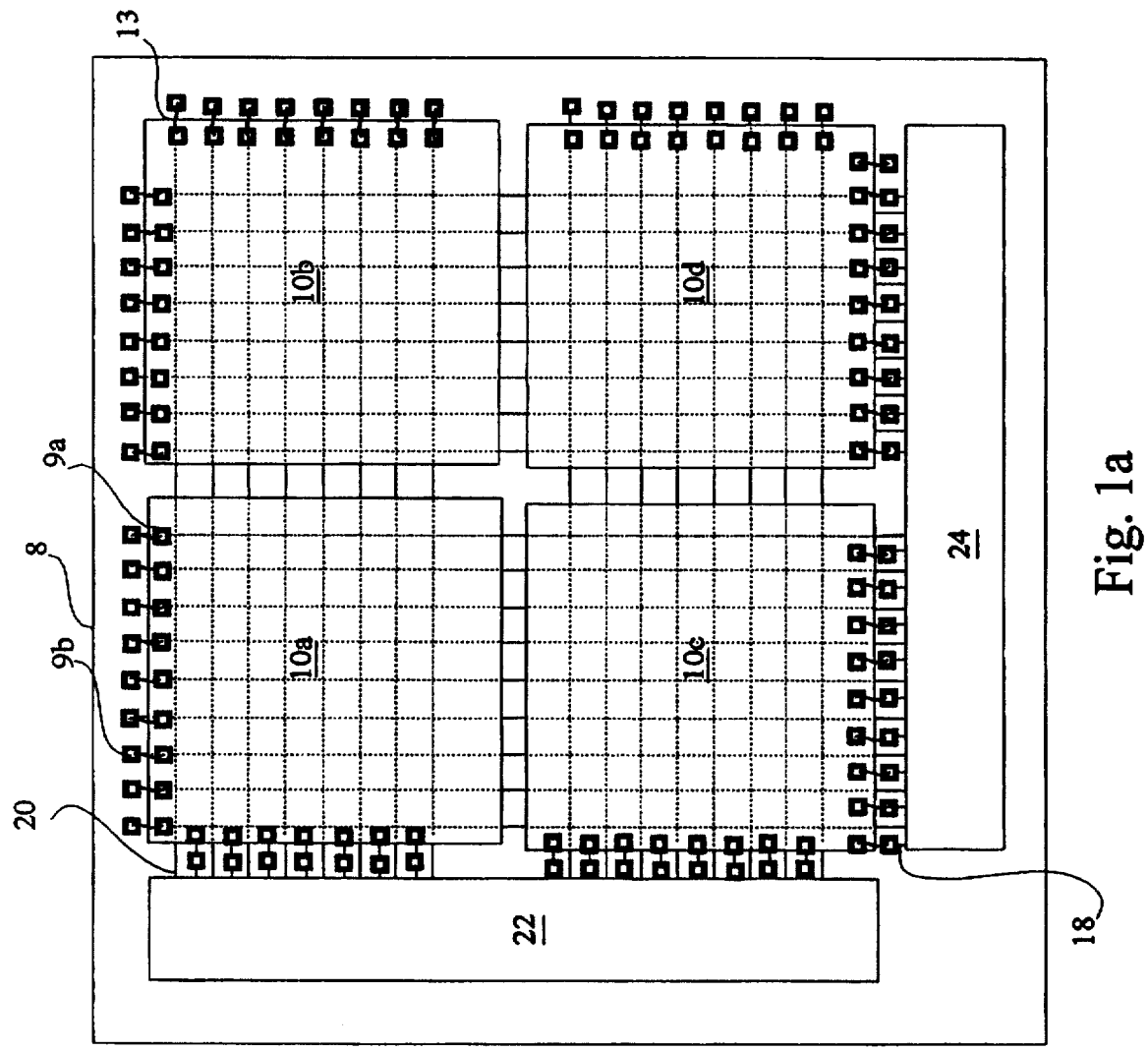
FIG. 1a is a simplified diagram of a sensing device in accordance with the invention showing an array of 4 sensing elements together with associated addressing circuitry.
Figure 1B:
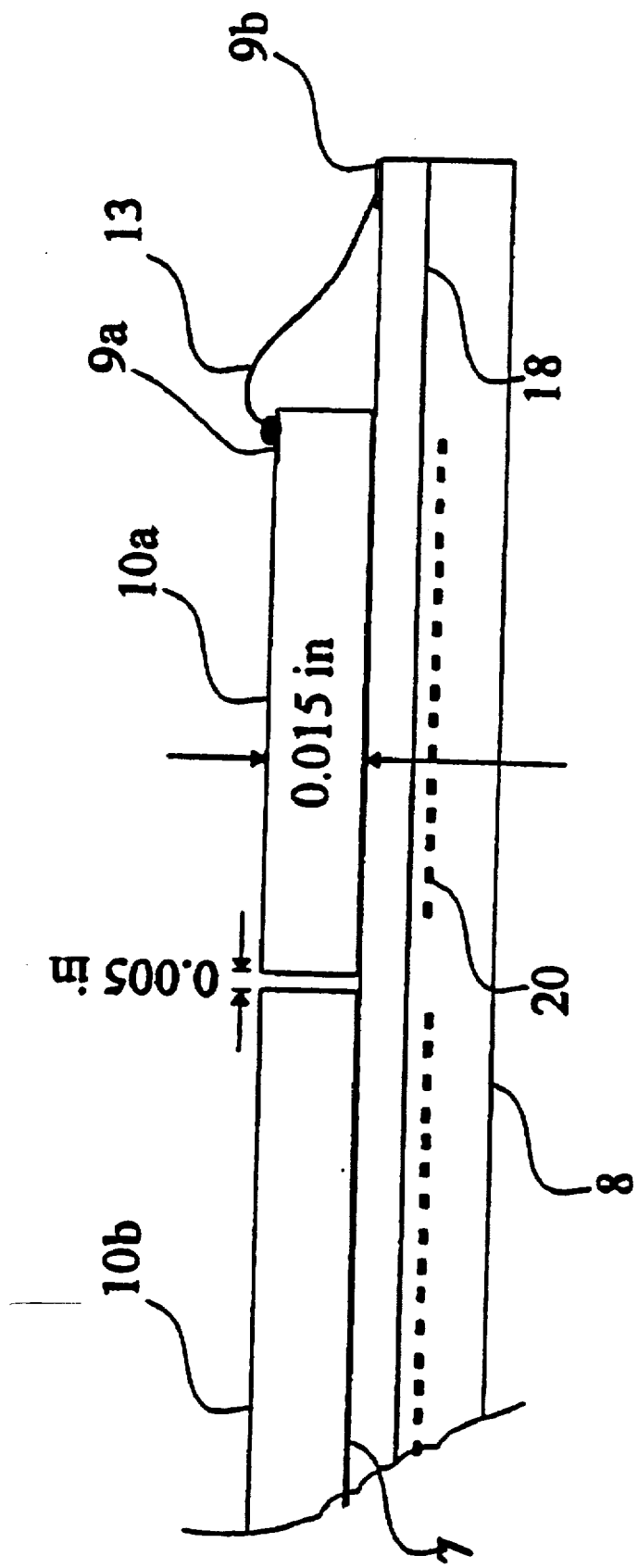
FIG. 1b is cut away pictorial side view illustrating one of the contact imaging devices shown in FIG. 1a, assembled on to a carrier board of FR4 via Ceramic (Al$_2$O$_3$) carrier in accordance with the invention.
Figure 1C:
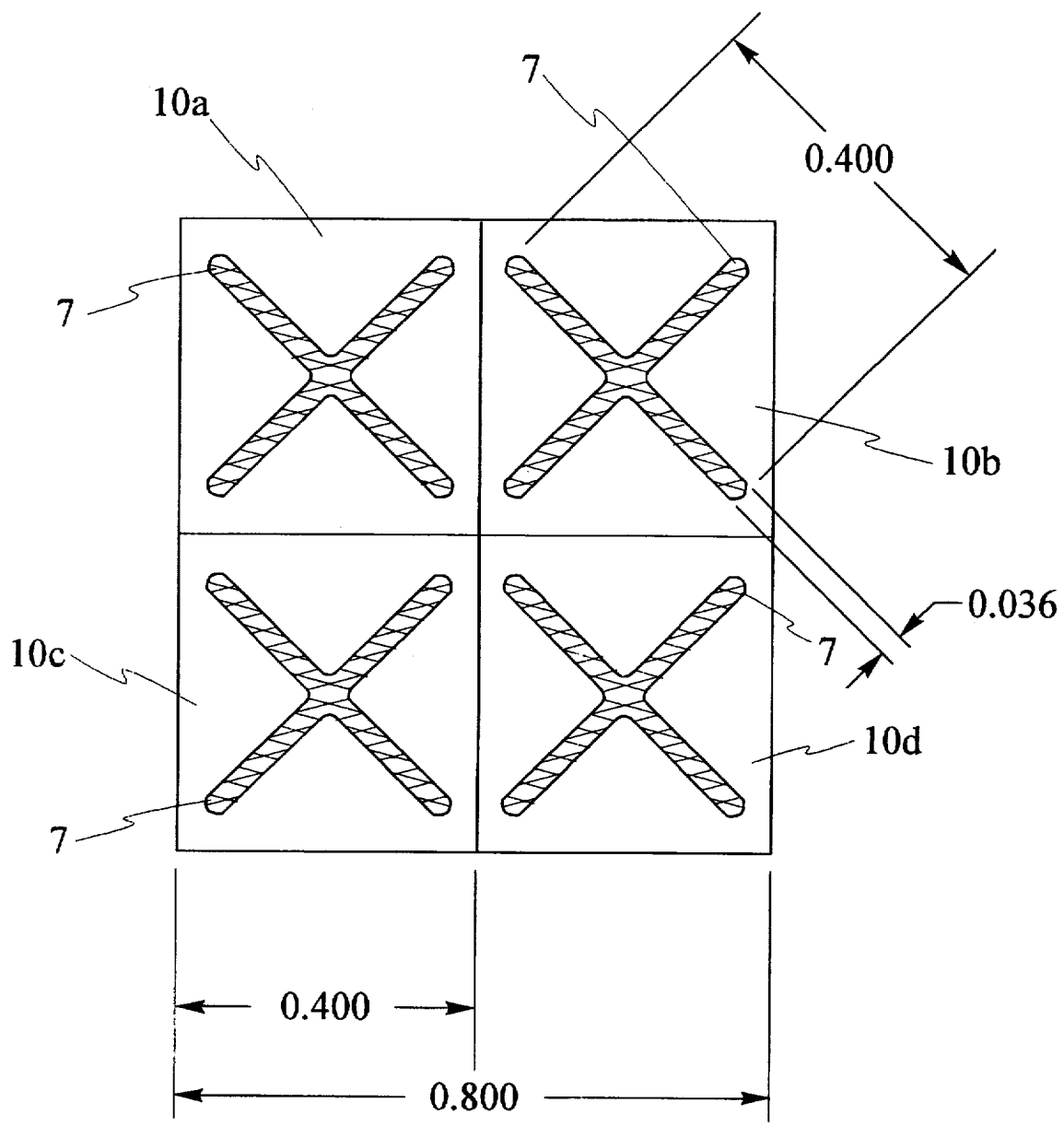
Figure 1D:
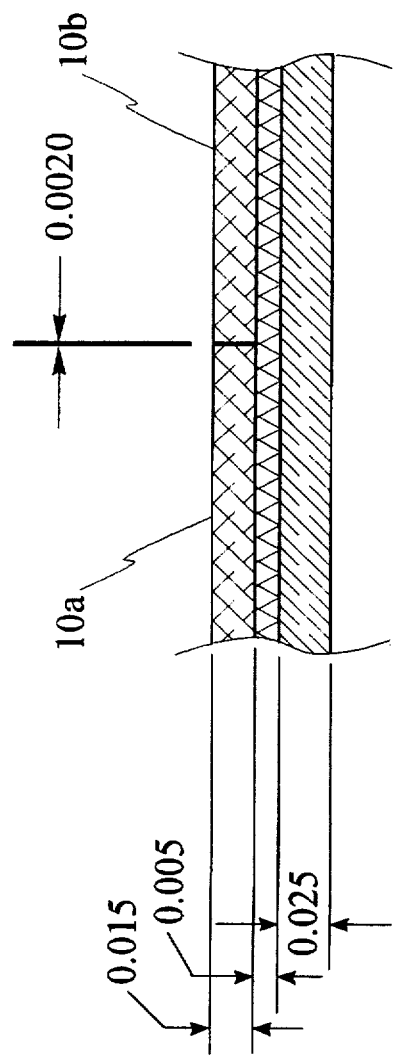
FIG. 1d is a cut-away side view of a silicon chip attached with an epoxy die attach to a substrate.
Figure 1E:
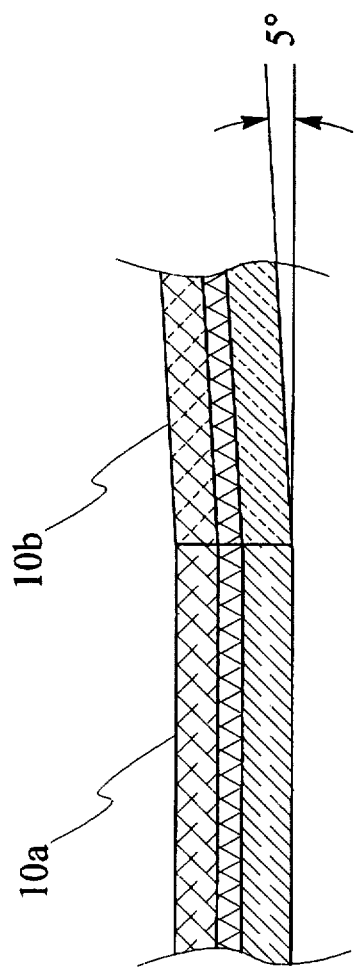
FIG. 1e is a cut-away side view of the silicon chip shown in FIG. 1d shown in a flexed position.

In contrast, turning now to FIG. 1a, a sensing device in accordance with this invention is shown, comprising, but not being limited to 4 sensing pads in the form of an array of discrete contact imaging dies that are disposed next to one another is a close, but non-contacting relationship. Preferably, the sensing pads 10a, 10b, 10c, and 10d, (generally referred to as 10) comprise a total surface area large enough to accommodate a finger and are in as near a proximity to one another as is possible; however, under all conditions there must be a small gap between adjacent dies to avoid contact between adjacent edges. The gap must also be suitable to ensure that wiping of adjacent edges does not occur when at least one sensing pad next to another is flexed under the force of a finger pressed upon it. Thus it is preferred there be a gap of approximately 0.0020 in. or greater between adjacent sensing pads. On the other hand if the gap is too large, areas of a finger covering the gap will not be sensed. Referring now to FIGS. 1d and 1e, a gap of 0.0020 in. between adjacent silicon chips (sensing pads 10a and 10b) is shown that allows flexure of up to 5° without adjacent edges of the sensing pads 10a and 10b physically wiping against one another. In the embodiment shown in FIGS. 1a to 1e, each sensing pad includes approximately 100 rows and 100 columns of regularly spaced sensing elements, each pad occupying an area of approximately 0.4 in×0.4 in. We have found that a system with a single silicon sensing pad having larger dimensions of approximately 0.75 in.×0.75 in. or greater as is taught in the prior art, is not practicable. As is illustrated in FIG. 1b, the 4 contact imaging devices are assembled on to a carrier board of FR4 or Ceramic (Al$_2$O$_3$). The dies 10a through 10d are bonded to the substrate 8 using a suitable adhesive such as epoxy 7. An Ablestick 84LMIT™ epoxy is used where back side connectivity from the die to a ground plane is required. An X-pattern of epoxy 7 under each die is applied to the substrate to achieve nearly void-free die attachment. This is illustrated in FIG. 1c. The epoxy is dispensed through a syringe, (not shown,) having a needle radius of 0.0178 in. Approximately 0.0008 in$^3$ of epoxy is required to provide two lines of epoxy 0.4 in. long forming the X-pattern shown. The die 10 is then pressed into epoxy 7 using a vacuum gripper (not shown). The final die height in the epoxy 7 is controlled using a robotic placement cell (not shown) pushing the die to a predetermined depth into the epoxy 7, or by placing glass beads of a known diameter into the epoxy as a form of stand-off to ensure that the dies are being glued to at a desired height from the substrate.

After the dies 10a, 10b, 10c, and 10d are glued onto the carrier substrate 8, they are electrically connected to routing tracks (18 or 20) that have been deposited onto the substrate. The electrical connection is made via a wire bond 13 between the die bond pad 9a and the substrate bond pad 9b as is shown in FIG. 1c. Gold wire bonds 13 that resist corrosion are preferred.

In order to protect the silicon die, a passivation coating of silicon nitride is added to the chip surface to protect it from moisture, oil, and salt usually present on finger tips. A further coating of gas deposited Parlyne C is used as a final surface coating to protect against passivation defects such as pinholes and scratches on the assembly.

Figure 1F:
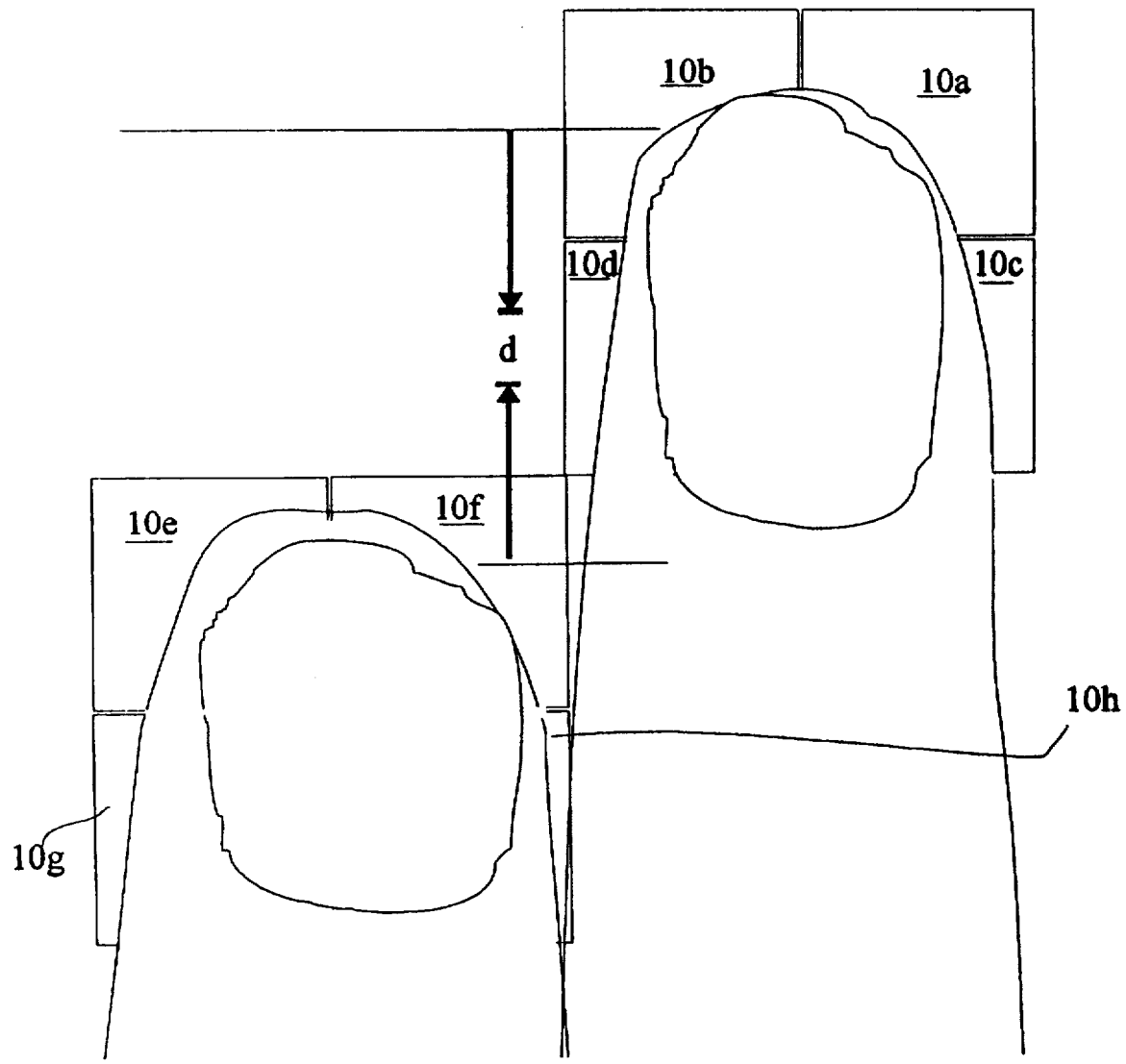
FIG. 1f is a plan view showing an alternative embodiment of the invention including an array of dies that accommodates two fingers to be scanned.
Figure 1G:
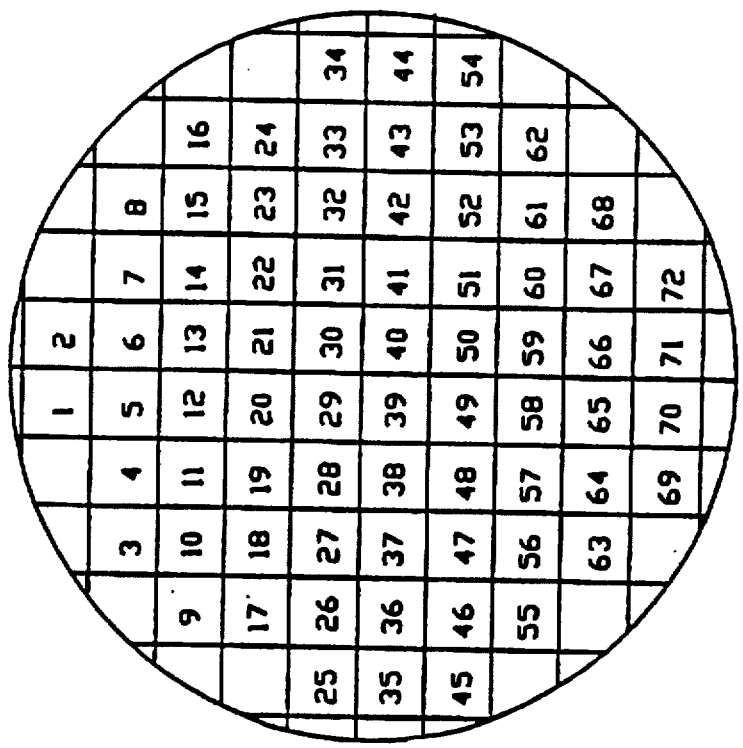
FIG. 1g is an illustration of the yield difference between two different sized silicon wafers.
Figure 1G:
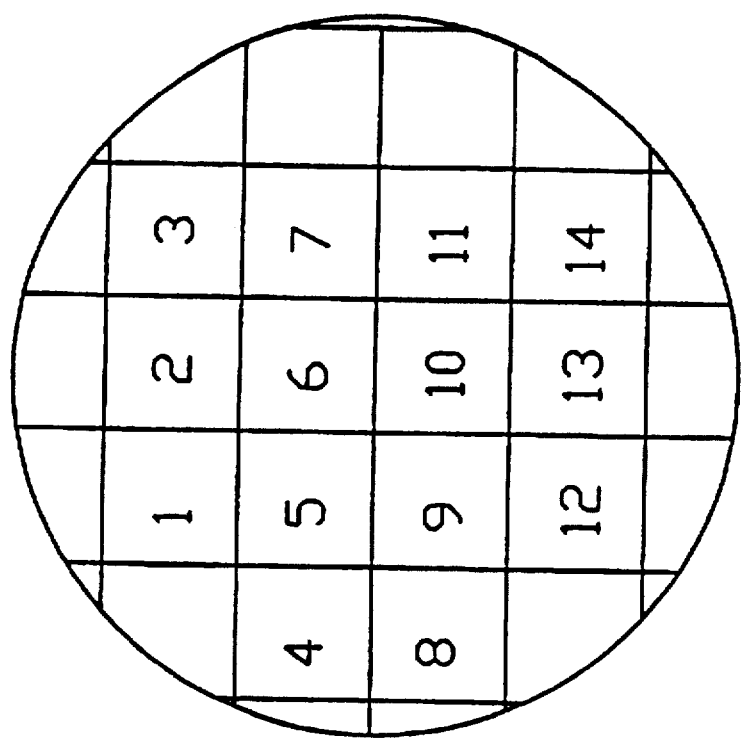

Turning now to FIG. 1f, a sensing device in accordance with the invention is shown that includes two 4×4 arrays 10a–10d and 10e–10h of silicon dies. Each 4×4 array of dies is spaced as described above, having a minimal spacing, yet have a small gap to ensure that adjacent edges do not contact one another. Advantageously, the device in accordance with this embodiment receives two fingers, for example an index finger and an adjacent second finger. Suitably programmed software through standard algorithms compares the data from the two fingers with characteristical data of one or a plurality of fingerprints previously stored. Furthermore, the relative distance between the outermost detectable ridges of the adjacent fingers can be used as a further indicator of correspondence to previously stored data.

Figure 2:
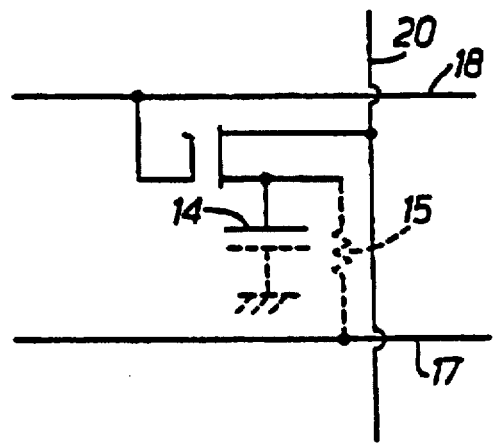
FIG. 2 shows a prior art schematically equivalent circuit for a typical sense element of the device shown in FIG. 1 and FIG. 1a, comprising a sense electrode and associated switching device.

Referring to FIG. 2, each sense element of the array comprises a sense electrode 14 connected to an active device which comprises a three terminal switching device 16 in the form of a field effect transistor (FET). The X-Y array of sense elements is addressed via sets of row (selection) and column (sensing) address conductors 18 and 20, respectively, with individual sense elements being located at respective intersections of the conductors. All sense elements in the same row are connected to a respective common row conductor 18 and all sense elements in the same column are connected to a respective common column conductor 20. The row conductors 18 are connected at their one ends to a row driver circuit, generally referenced at 22, and the column conductors 20 are connected at their one ends to a sensing circuit, 24 shown in FIG. 1a.

As can be seen, the gate and source of the FET 16 of a sense element are connected respectively to a row conductor 18 and a column conductor 20. The FET's drain electrode is connected to the sense electrode 14.

Fabrication of the sense elements 12 and address conductors 18 and 20 of the pads 10a through 10d are based on technology used in active matrix addressed display devices, such as liquid crystal display devices. This technology is now well established as a means for producing active matrix arrays, and, as such, it is considered unnecessary to describe here in detail the methods by which the sensing device can be fabricated. Briefly, the method typically involves the deposition and definition by photolithographic processes of a number of layers on an insulating substrate. The electrodes 14 and sets of address conductors 18 and 20 can be formed of metal and the FETs 16 can be formed as amorphous silicon or polycrystalline silicon thin film transistors (TFTs) using an appropriate, e.g., glass or quartz, substrate.

Figure 3:
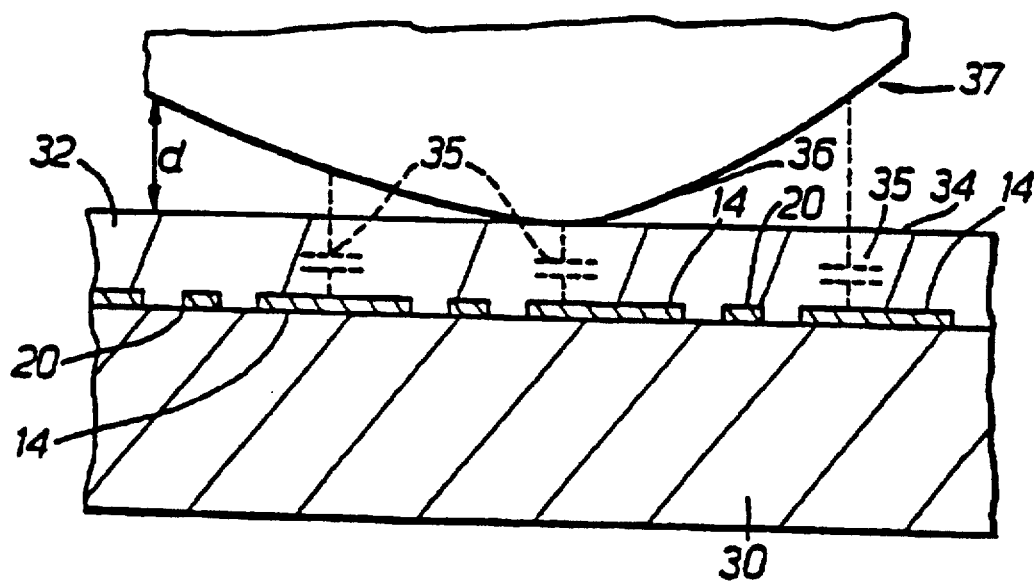
FIG. 3 is a schematic cross-sectional view through a part of one of the arrays of sensing elements illustrating its operation.

An example of one form of construction is shown schematically in FIG. 3 which is a cross-section through a representative part of the pad 10a comprising three complete sense electrodes 14. The TFT structures, which have been omitted for clarity, are formed on a glass or quartz substrate 30, by depositing a layer of amorphous or polycrystalline silicon material over the substrate and defining this layer to leave individual islands which eventually form the TFT's channels. Similarly a layer of insulating material, for example, silicon nitride, is deposited and defined to form the gate insulator layers of the TFTs. The electrodes 14, comprising regularly spaced and equally sized rectangular pads, and the set of address conductors 20 extending therebetween are defined from a deposited metal layer. Integral extensions of the electrodes 14 and conductors 20 respectively form the drain and source contacts of the TFTs. Further insulating material is provided, over the conductors 20 at least at the regions where they are to intersect the address conductors 18. The set of conductors 18, not visible in FIG. 3, is then formed from a deposited metal layer with each conductor extending between adjacent rows of electrodes 14 and having integral extensions along its length which overlie respective semiconductor islands and serve as gate electrodes of the TFTs. The resulting structure is similar to the active matrix structure of a display device with the sets of address conductors 18 and 20 and sense electrodes 14 being analogous, respectively, to the sets of gating and signal conductors and display element electrodes of a display device. Fabrication is, however, made simpler in view of the fact that metal is used for the electrodes 14 rather than transparent conductive material, such as ITO, which is necessary for display element electrodes in a display device.

To complete the structure of the sensing device, an insulating film 32, for example, of silicon nitride or polyimide, is deposited completely over the structure on the substrate 30 to provide a continuous sensing surface 34 spaced from, and substantially parallel to, the substrate surface. A deposited Parlyne C coating (not shown) is used as a final passivation coating on the assembled device.

The physical dimensions of the sense electrodes are chosen in accordance with the desired resolution characteristics in fingerprint sensing. By way of example, the sense electrodes may have a pitch of around 100 micrometers in both the row and column directions. The thickness of the insulating film 32 is selected taking into account the particular material used for this film. For example, in the case of a material having a relative permittivity of approximately 4, a film thickness of around 4 micrometers is chosen.

In the operation of this sensing device, a finger whose print is to be sensed is placed on the sensing surface 34. Actual, or close, physical contact with the surface 34 then occurs at the ridges of the finger surface, as illustrated in FIG. 3 where one ridge 36 of part of the finger surface 37 is depicted. Troughs in the finger surface adjacent to the ridges are spaced from the surface 34 by a considerably greater distance. The ridged finger surface is therefore spaced from the array of electrodes 14 by a minimum distance determined by the thickness of the thin insulating film 32. Each sense electrode 14 and the respective overlying portion of the finger surface form opposing plates of a capacitor 35, as depicted by dotted lines in FIG. 3, with the plate constituted by the finger surface portion being at ground potential. The intervening material of the insulating film 32, and air gap, between the finger surface portion and the sensing surface 34, if present, provide the capacitor dielectric. The capacitances of these individual capacitors varies as a function of the spacing, d in FIG. 3, between the finger surface and the sensing surface 34, with the larger capacitances occurring where the finger surface ridges are in contact with surface 34 and the smaller capacitances occurring where the troughs in the finger surface overlie the sense electrodes 24.

Figure 4:
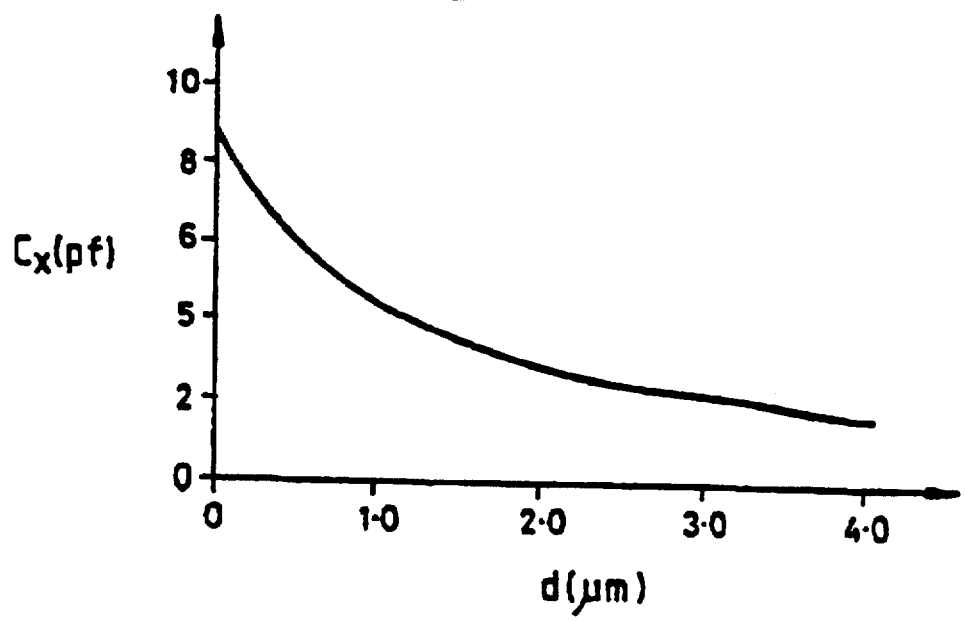
FIG. 4 illustrates graphically the relationship between capacitance and finger surface distance for a typical sense electrode of the device in accordance with this invention.

This variation in capacitance is illustrated in FIG. 4 in which the relationship between the capacitance Cx, in picofarads per square millimeter, of a capacitor 35 and the spacing d, in micrometers is shown graphically for the case in which the insulating film is of a material having a relative permittivity of 4 and is 4 micrometers in thickness. The variation in capacitances produced over the array of sensing elements 12 of the pad 10 by a fingerprint ridge pattern thus constitutes in effect an electronic "image" of the three dimensional form of the fingerprint surface. These capacitances are sensed within the sensing device, and an output indicative of the variation, and, hence the three-dimensional profile of the fingerprint, is provided. The three dimensional ridge pattern of a fingerprint is reproduced in the form of an electronic image by monitoring the capacitance variation between the individual sense electrodes in the array and the ridged finger surface. Because the variation in capacitances is determined by the three dimensional form of the finger, any attempt at fraudulent use by producing a dummy finger is made very difficult.

Sensing the capacitance variation between the various sense elements 12 in the array is accomplished as follows. Each sense element is addressed through its associated row (selection) and column (sensing) conductors 18 and 20. A gating pulse applied to a row conductor 18 by the row driver circuit 22 turns on the FETs 16 of all sense elements 12 in the row of elements associated with the row conductor. A predetermined potential of around 10 volts is simultaneously applied by the circuit 24 to all column conductors 20 so that upon the FETs 16 being turned on the capacitors 35 associated with the sense elements 12 of that row are charged to the potential of the column conductors. The charging current for the capacitors flows up the column conductors 20 and is sensed by an appropriate amplifier within the circuit 24. The magnitude of the charge flowing into each capacitor 35 depends on the size of the capacitor. Therefore, by measuring the charging currents in each column conductor 20 the size of each capacitor can be assessed. This procedure is repeated for each row of sensing elements of the array in turn sequentially so that a complete "image" of the capacitor characteristics is built up following the addressing of all rows in the array in one complete field period.

The addressing scheme in the instant invention of FIG. 1a is similar to the one described in U.S. Pat. No. 5,325,442 with the exception that the row driver 22 and sensing circuit 24 in this invention is partitioned between the multiple dies 10a to 10d. In operation, when an image is scanned from the contact imaging arrays 10a through 10d, the row driver 22 and element sensing circuit 24, essentially step over the boundaries between the contact imaging dies 10a, 10b, 10c, and 10d through the routing on the carrier substrate. Thus, the number of devices in the imaging array are transparent to the driver and sensing circuit 22 and 24 respectively.

Figure 5A:
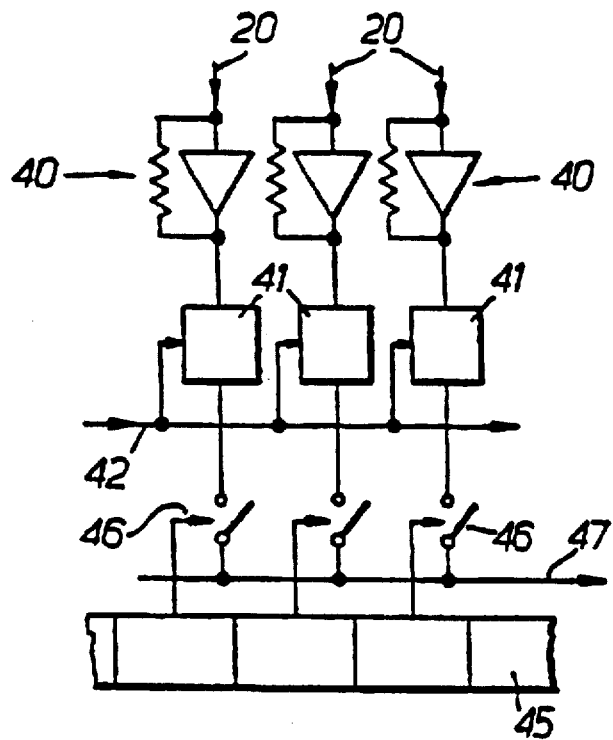
FIGS. 5a and 5b show respectively parts of two alternative prior art sensing circuits that may be utilized in the sensing device of this invention.
Figure 5B:
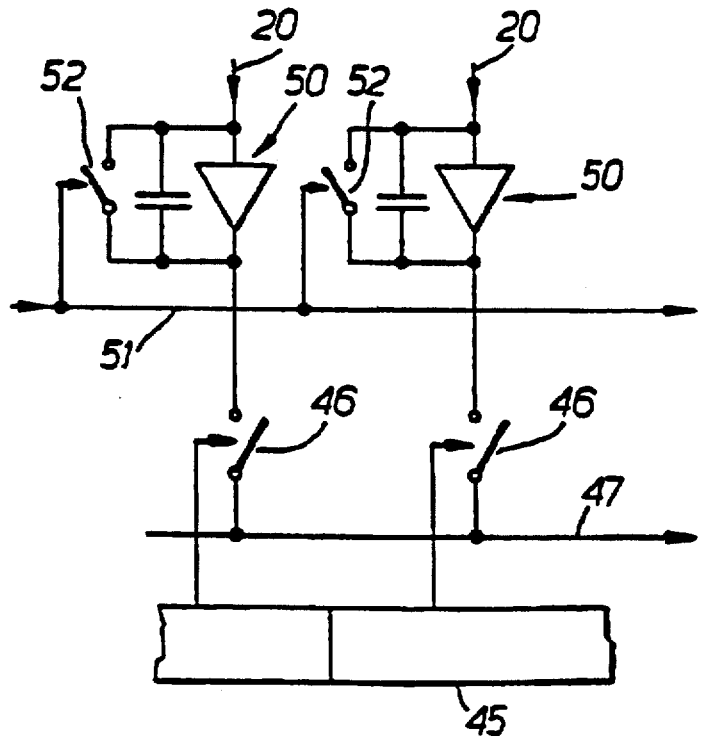

Prior art FIGS. 5a and 5b respectively illustrate two alternative sensing circuits which may be used to sense the charging characteristics of the capacitors. FIG. 5a shows a part of current sensing circuit configuration for three adjacent column conductors 20. The column conductors 20 are connected to respective current amplifiers 40 with resistive feedback whose outputs are supplied to sample and hold circuits 41. The bias condition of the amplifiers sets the aforementioned predetermined potential level on the column conductors 20. These circuits 41 are operated simultaneously, and in synchronism with the gating pulse applied to a row conductor 18, by means of a sampling pulse supplied along a common line 42. The analog outputs of the circuits 41 are switched in succession by means of a shift register 45 operating switches 46 in sequence to provide a serial output of pulses along line 47 whose magnitudes are indicative of the instantaneous current values in each of the conductors 20.

FIG. 5b illustrates a charge amplifier circuit configuration, the part shown serving two adjacent column conductors 20. In this circuit, the column conductors 20 are connected to charge amplifiers 50 with capacitive feedback whose analog outputs are similarly switched in succession by means of a shift register 45 operating switches 46 to provide on output line 47 a serial train of pulses whose magnitude is indicative of the charge flow in each column conductor. The charge amplifiers 50 are reset in the period between addressing successive rows of sensing elements by a reset pulse applied to a reset line 51 which operates switches 52 to discharge the shunt capacitors of the amplifiers.

In order to allow several readings of the capacitance image of the fingerprint, or readings of different fingerprints in consecutive operations, it is necessary to ensure that the charge on the electrodes 14 is removed or reduced before the sense elements are addressed again. This may be achieved by incorporating a resistor in each sense element connected between the sense electrode 14 and either a grounded conductor common to all sense elements of a respective row or to the next adjacent row conductor 18. Such an arrangement is shown in dotted form in FIG. 2 with the resistor and additional adjacent row conductor being referenced 15 and 17, respectively. The resistors may comprise suitably doped semiconductor material used for fabricating the TFTs.

Other approaches may, however, be employed. The predetermined voltage applied to the column conductors can be changed between two different levels on successive read cycles. The bias condition of the amplifiers can again be used to provide one of these levels. The other level may be provided by a means of a switch inserted between the conductor 20 and its associated amplifier 40 or 50. Alternatively, an intermediate reset cycle could be included in the addressing scheme.

All these approaches ensure that each time the sense elements are addressed some charging of the capacitors occurs so that the charging currents can be used to determine their capacitance.

Figure 6A:
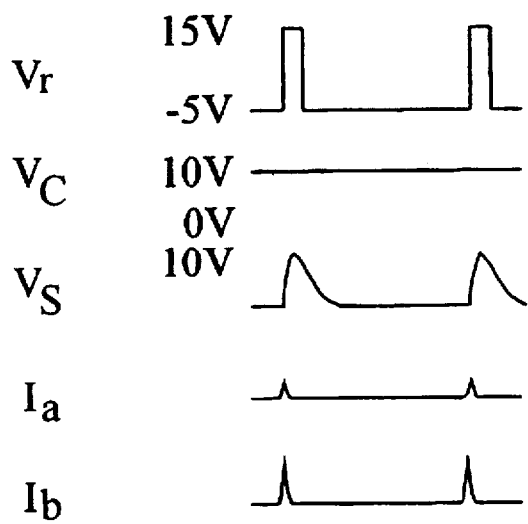
FIGS. 6a–c illustrate typical waveforms present in operation of the sensing device.
Figure 6B:
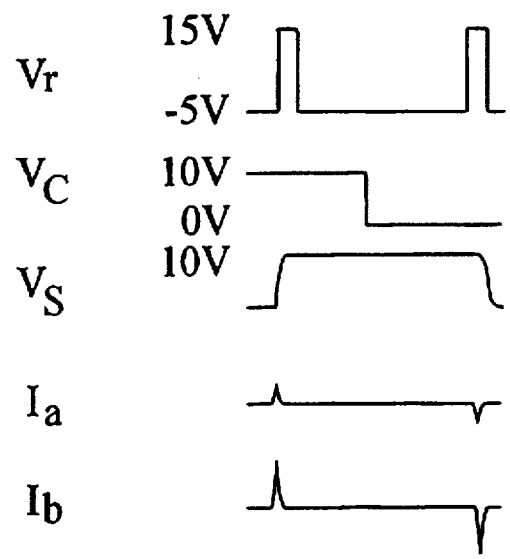
Figure 6C:
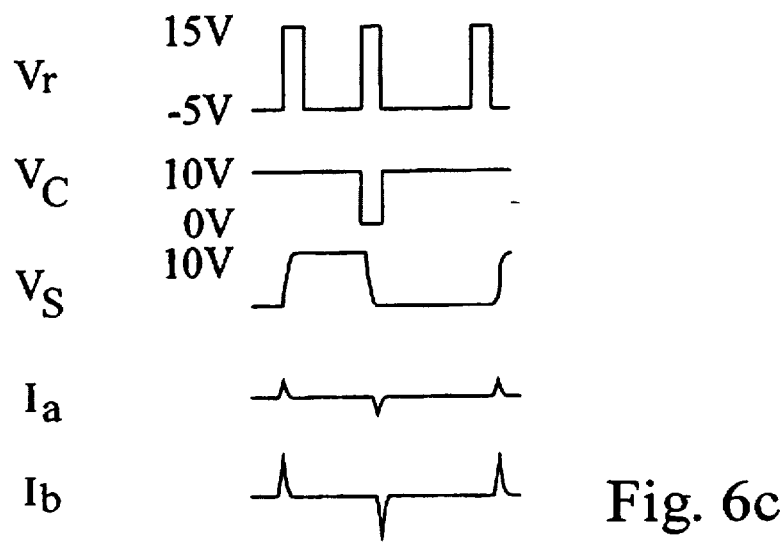

Typical waveforms present in operation of the sensing device are shown, by way of example, in FIGS. 6. More particularly three sets, A, B and C, of waveforms are shown for different modes of operation, where set A is for the version in which a resistor 15 is included in each sense element, set B is for a version in which the column voltage is inverted between successive reading cycles, and set C is for a version having an intermediate reset cycle. Vr and Vc are the voltages applied to a row conductor 18 and a column conductor 20, respectively, and Vs is the resultant voltage appearing at a sense electrode 14. Ia and Ib are the consequential currents flowing in the column conductor 20 for comparatively low and high capacitances Cx respectively. It will be appreciated that the particular voltages referred to in FIGS. 6 are by way of example only.

Various modifications to the sensing device are possible. In the above-described embodiment, the sensing surface, 34, is provided solely by the exposed surface of the insulating film 32. FIGS. 7a and 7b show, in schematic plan view, different forms of the sensing device in which metal film conductors 53 are deposited directly on the exposed surface of the film 32 overlying the spaces between adjacent rows and columns of sense electrodes 14, either in the form of a grid conductor pattern, FIG. 7a, or as linear conductors, FIG. 7b. In operation these conductor patterns are grounded to improve the electrical contact to the finger surface.

Referring now to prior art FIG. 8 there is shown a schematic cross-section view, similar to FIG. 3, through part of another embodiment of sensing device. This embodiment includes a further array of electrodes provided on the surface 34 of the insulating film 32. This array consists of discrete, electrically-isolated, conducting pads 54 approximately the same size and shape as, and substantially overlying, the sense electrodes 14. These pads 54 form, together with the electrodes 14, the opposite plates of the capacitors 35. Apart from the pads 54, this embodiment is the same as the previously-described embodiment and operation of the active matrix array of sense elements is generally identical. In use, a finger is placed over the array of pads 54 on the surface 34. Ridges of the fingerprint then contact and ground particular pads 54 of the array whereby the capacitance of the capacitors 35 at the sense elements concerned is determined by opposing electrodes 14 and 54 and the thickness of the film 32. Compared with the previous embodiment, substantially identical and more distinctive capacitances are obtained at all ridge contact locations. Elsewhere, surface portions of the finger are spaced from their underlying pads 54 and the capacitance values are dependent on this spacing as before. The capacitance variation across the array is thus indicative of the fingerprint's surface topology.

With regard to all the above-described sensing devices, the FETs 16, as previously mentioned, may comprise amorphous silicon or polycrystalline silicon TFTs fabricated using standard processes known in the art of display devices. It is envisaged though that the array of FETs 16 could instead form part of a conventional semiconductor integrated circuit using, for example, a silicon wafer substrate.

In the case where polycrystalline silicon is used, the addressing circuits 22 and 24 may conveniently be formed simultaneously with the FETs 16 at the periphery of the substrate 30 so as to be integrated with the active sensing matrix and provide a very compact sensing device.

FIG. 9 illustrates in schematic block form, a fingerprint recognition system employing a sensing device as described previously, here referenced at 60. The signal output from the sensing device 60 is in a form akin to the video type output provided by known optical type fingerprint sensing devices using image sensors. Accordingly, it will be appreciated that apart from the sensing device the components of the system generally follow conventional practice as will be apparent to persons skilled in the art, and it is considered unnecessary, therefore, to describe these components in detail. Briefly, the output from the device 60, suitably conditioned, is fed to an analysis circuit 61 which is programmed to detect characterizing features of the fingerprint sensed such as the position of minutiae. Data from the circuit 61 is supplied to a computer 62 which through standard algorithms compares the data with characteristical data of a plurality of fingerprints, or a single fingerprint depending on whether the system is used for identification or merely verification purposes, held in a storage device 63 and which provides an output in accordance with whether or not a match has been found.

The circuit 61 can be programmed either to utilize the three dimensional information provided by the sensing device for high accuracy of recognition, or alternatively, with appropriate discrimination to select particular output signal values from the device 60, utilizing specific information representative of the two dimensional ridge pattern in the nature of a binary image similar to that obtained from known optical sensing devices.

Numerous other embodiments may be envisaged without departing from the spirit and scope of the invention.

What I claim is:

1. A fingerprint sensing device comprising:

a substantially rigid substrate;

an array of semiconductor dies spaced in close proximity to each other for sensing a fingerprint, the array of dies being bonded to the substrate, each die comprising an array of sense elements for sensing the presence of a fingerprint ridge upon the device, wherein adjacent dies in the array of dies are spaced such that adjacent edges do not touch one another when a finger is pressed on the dies.

2. A fingerprint contact imaging device, comprising a) a plurality of semiconductor spaced apart dies, each having an array of sense elements, each of which includes sense electrodes and a switching device coupled to one another, all of the sense electrodes of said sense elements being covered by dielectric material defining a sensing surface adapted to receive at least a portion of a finger having individual finger surface portions;

b) drive means coupled to all of the switching devices of said sensing elements for controlling and addressing each switching device according to a sequence independent of the fingerprint to be sensed so that a predetermined potential is applied via each switching device when addressed to the sense electrode coupled thereto; and c) sensing means coupled to all of the switching devices of said sense elements for sensing capacitance based on said individual finger surface portions in combination with sense electrodes of said sense elements, the dies being arranged in a tightly spaced array of dies and being bonded to a substrate.

3. A fingerprint capture device comprising:

a substrate;

an array of at least 4 spaced apart dies bonded to the substrate, each die comprising an array of sense elements for sensing the presence of a fingerprint ridge upon the device, the substrate including a plurality of conductors providing a plurality of electrical paths from the sense elements on each of the 4 spaced apart dies, to driving sensing circuitry; and processor means coupled to the driving and sensing circuitry for processing signals provided from the sensing circuitry.

4. A fingerprint sensing device as defined in claim 1, wherein the array of dies, includes 4 dies, adjacent dies having a space between their adjacent edges of approximately 0.0020 inches or greater.

5. A fingerprint sensing device as defined in claim 4, wherein the space between the adjacent edges of adjacent dies is less than 0.01 inches.

6. A fingerprint sensing device as defined in claim 5, wherein each of the dies has a surface area of approximately less than or equal to 6 cm².

7. A device as defined in claim 3, wherein the dies are spaced apart from each other by a distance of approximately more than 0.0020 inches to avoid adjacent edges of adjacent dies from touching one another when force is placed upon a die from a finger and approximately less than 0.010 inches so that portions of a finger covering spaces between the dies absent of any sense elements will be minimized.

8. A fingerprint sensing device as defined in claim 4, wherein the array of dies, includes 8 dies, the dies having a space between their adjacent edges of approximately 0.0020 inches or greater, the dies being arranged to accommodate portions of at least two fingers.

9. A fingerprint capture device as defined in claim 3, wherein the dies are comprised of silicon.

10. A fingerprint sensing device as defined in claim 1 wherein the array of dies is a two-dimensional array of dies.

11. A fingerprint sensing device as defined in claim 10 wherein the array of sense elements is a two-dimensional array of sense elements.

12. A fingerprint sensing device as defined in claim 1 wherein the array of sense elements is a two-dimensional array of sense elements.

13. A fingerprint sensing device as defined in claim 1 wherein the array of dies, includes 4 dies, each die adjacent two other dies and adjacent dies having a space between their adjacent edges of approximately 0.0020 inches or greater.

14. A fingerprint contact imaging device as defined in claim 2 wherein each array of sense elements comprises at least two rows and at least two columns.

15. A fingerprint capture device as defined in claim 3 wherein the dies are disposed in at least two rows and at least two columns.

* * * * *